(12) United States Patent
Chen

(10) Patent No.: US 9,119,328 B2
(45) Date of Patent: Aug. 25, 2015

(54) ELECTRONIC ASSEMBLY WITH FLEXIBLE FIXTURES FOR SPREADING LOAD

(71) Applicant: Foxconn Technology Co., Ltd., New Taipei (TW)

(72) Inventor: Rung-An Chen, New Taipei (TW)

(73) Assignee: Foxconn Technology Co., Ltd., New Taipei (TW)

( * ) Notice: Subject to any disclaimer, the term of this patent is extended or adjusted under 35 U.S.C. 154(b) by 273 days.

(21) Appl. No.: 13/862,660

(22) Filed: Apr. 15, 2013

(65) Prior Publication Data
US 2014/0002999 A1    Jan. 2, 2014

(30) Foreign Application Priority Data
Jun. 29, 2012    (TW) .............................. 101123564 A

(51) Int. Cl.
H05K 7/20    (2006.01)
H01L 23/40    (2006.01)
H01L 23/427    (2006.01)

(52) U.S. Cl.
CPC ........ *H05K 7/20509* (2013.01); *H01L 23/4006* (2013.01); *H01L 23/427* (2013.01); *H01L 2023/405* (2013.01); *H01L 2023/4068* (2013.01); *H01L 2023/4081* (2013.01); *H01L 2023/4087* (2013.01); *H01L 2924/0002* (2013.01)

(58) Field of Classification Search
CPC ....................... H05K 7/20336; H05K 7/20149
USPC .......... 361/679.46–679.54, 688–723, 679.52; 165/80.4–80.5, 104.33; 257/714–718, 257/E23.088; 174/15.2
See application file for complete search history.

(56) References Cited

U.S. PATENT DOCUMENTS

| 6,304,453 | B1 | 10/2001 | Lo et al. | |
| 7,773,383 | B2 * | 8/2010 | Liang | 361/719 |
| 2008/0315405 | A1 * | 12/2008 | Yeh | 257/718 |
| 2009/0004902 | A1 | 1/2009 | Pandey et al. | |
| 2012/0044648 | A1 | 2/2012 | Lee et al. | |

FOREIGN PATENT DOCUMENTS

| JP | 2002-271066 A | 9/2002 |
| JP | 2010-532097 A | 9/2010 |
| TW | M399581 U1 | 3/2011 |
| TW | M424526 U1 | 3/2012 |

* cited by examiner

*Primary Examiner* — Jayprakash N Gandhi
*Assistant Examiner* — Mukund G Patel
(74) *Attorney, Agent, or Firm* — Novak Druce Connolly Bove + Quigg LLP

(57) ABSTRACT

An exemplary electronic assembly includes a heat spreader, a socket, and an electronic component received in the socket. The electronic component includes a substrate and a chip disposed at a center of the substrate. The chip contacts a bottom surface of the heat spreader. The electronic assembly further includes a pair of flexible fixtures. One end of each flexible fixture abuts against the heat spreader, and another end of each flexible fixture abuts against either the substrate or the socket.

16 Claims, 7 Drawing Sheets

US 9,119,328 B2

ELECTRONIC ASSEMBLY WITH FLEXIBLE FIXTURES FOR SPREADING LOAD

BACKGROUND

1. Technical Field

The disclosure relates to electronic assemblies, and more particularly to an electronic assembly with flexible fixtures holding a heat spreader in position.

2. Description of the Related Art

With the continuing development of electronics technology, many electronic components are nowadays made in a small size but with a high operating frequency capability. For example, electronic packages such as CPUs (central processing units) employed in electronic devices may run at very high speeds and generate much heat. A heat dissipation device is commonly installed in such kind of electronic device, in contact with the CPU for quickly dissipating the generated heat.

In a typical arrangement, the CPU is placed in a socket, and the socket is disposed on a main board such as a motherboard of the electronic device. This enables the CPU to be easily extracted when needed. The heat dissipation device is arranged in contact with a center of a top surface of the CPU. The heat dissipation device contacts the CPU firmly, to optimize heat transfer from the CPU to the heat dissipation device. This is achieved by external force applied on the heat dissipation device by fixing elements such as fasteners. However, because of the limited contact area between the CPU and the heat dissipation device, a periphery of the CPU is liable to deform. When this happens, the performance of the CPU may be impaired.

Therefore, it is desirable to provide an electronic device that can overcome the above-described problems.

BRIEF DESCRIPTION OF THE DRAWINGS

Many aspects of the disclosure can be better understood with reference to the drawings. The components in the drawings are not necessarily drawn to scale, the emphasis instead being placed upon clearly illustrating the principles of the present electronic assembly. Moreover, in the drawings, all the views are schematic, and like reference numerals designate corresponding parts throughout the views.

DETAILED DESCRIPTION

Figure 1:
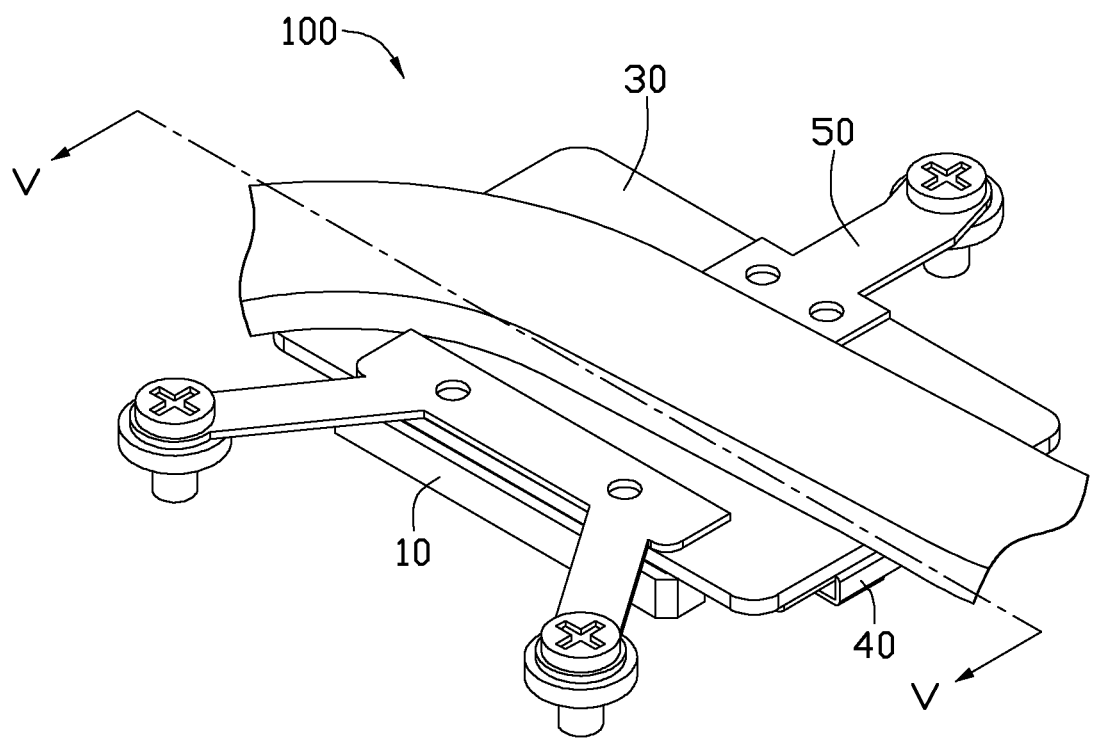
FIG. 1 is an assembled, isometric view of part of an electronic assembly with flexible fixtures in accordance with an embodiment of the disclosure.
Figure 2:
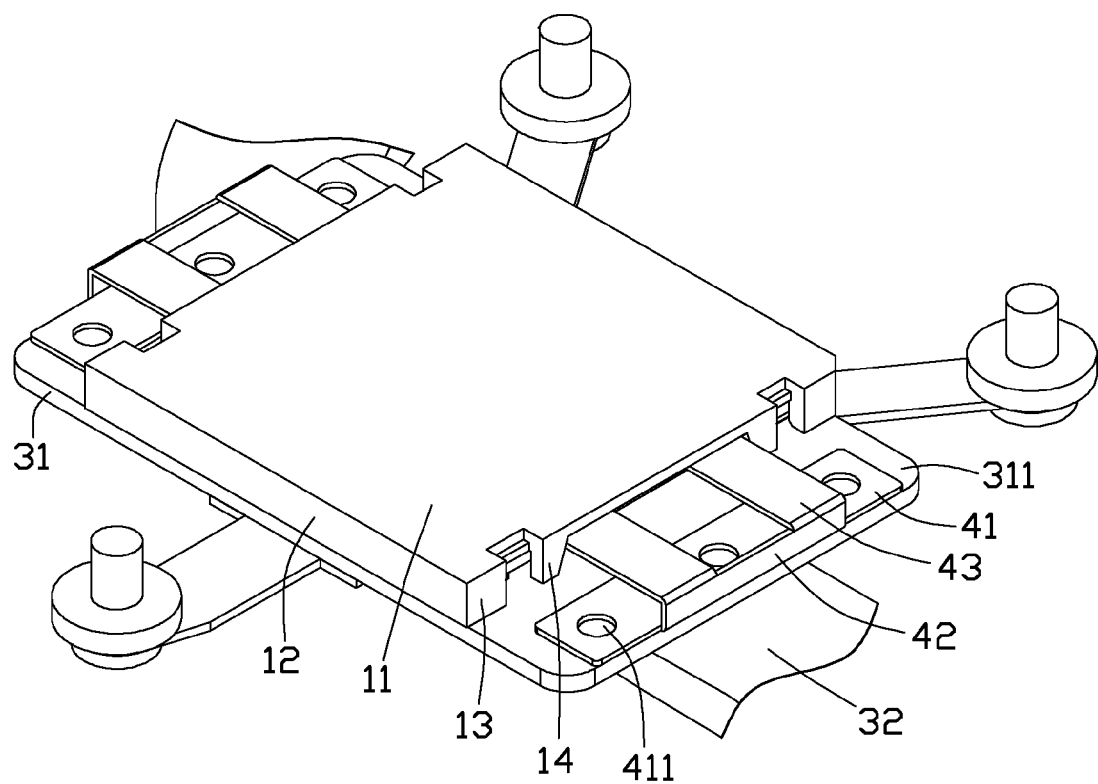
FIG. 2 shows the part of the electronic assembly with flexible fixtures of FIG. 1 inverted.
Figure 3:
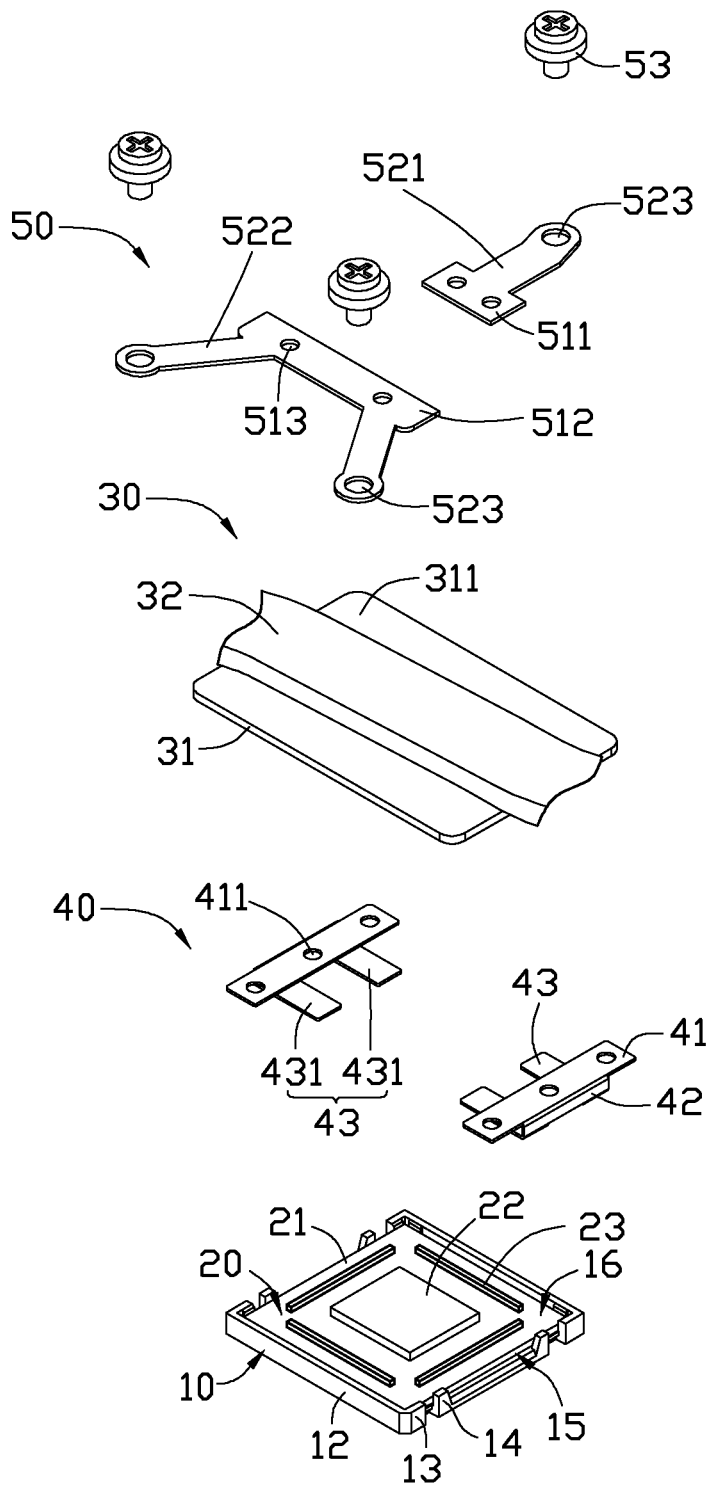
FIG. 3 is an exploded view of the part of the electronic assembly with flexible fixtures of FIG. 1.

Referring to FIG. 1 to FIG. 3, an electronic assembly 100 in accordance with an exemplary embodiment is provided. The electronic assembly 100 includes a socket 10, an electronic component 20 arranged in the socket 10, a heat dissipation device 30 connected to the electronic component 20, and a pair of flexible fixtures 40 and a pair of holding plates 50 for disposing the electronic assembly 100 onto a main board (not shown) such as a motherboard.

Specifically, the socket 10 includes a rectangular bottom plate 11, two sidewalls 12 extending upward from a pair of opposite edges of the bottom plate 11, a plurality of resisting blocks 13, and a plurality of positioning blocks 14. The resisting blocks 13 and the positioning blocks 14 extend upward from another pair of opposite edges of the bottom plate 11. There are two resisting blocks 13 at each of the opposite edges of the bottom plate 11. There are two positioning blocks 14 at each of the opposite edges of the bottom plate 11. Each resisting block 13 connects one end of a corresponding sidewall 12 to form a corner. The two positioning blocks 14 at each edge are spaced from each other, and are both located between the two resisting blocks 13. A positioning groove 15 is formed between the two positioning blocks 14. The bottom plate 11, the sidewalls 12, the resisting blocks 13 and the positioning blocks 14 cooperatively form a cavity 16 therebetween to receive the electronic component 20.

In this embodiment, the electronic component 20 is a CPU (central processing unit). The electronic component 20 includes a substrate 21, and a chip 22 located at a center of the substrate 21. The substrate 21 is square, and is slightly smaller than the bottom plate 11 of the socket 10. The substrate 21 is received in the cavity 16 and resists the sidewalls 12, the resisting blocks 13 and the positioning blocks 14. The chip 22 is square, and a top surface of the chip 22 is higher than that of both the sidewalls 12. A plurality of flexible bars 23 is disposed on the substrate 21, around the chip 22. The flexible bars 23 are made of flexible material such as rubber.

The heat dissipation device 30 includes a heat spreader 31, and a heat pipe 32 attached to a top surface of the heat spreader 31. The heat spreader 31 is rectangular. A bottom surface of the heat spreader 31 firmly contacts the top surface of the chip 22 to conduct heat generated by the chip 22. A main central portion of the heat spreader 31 lies directly over the socket 10, and opposite longitudinal edges of the heat spreader 31 abut the sidewalls 12. Two opposite end portions 311 of the heat spreader 31 protrude out from opposite sides of the socket 10, respectively. The heat pipe 32 absorbs heat of the heat spreader 31. The heat is then transferred from the heat pipe 32 to a dissipation module (not shown), and then dissipated into ambient air efficiently.

In this embodiment, the flexible fixtures 40 are made of flexible metallic material. The two flexible fixtures 40 extend downwards from bottom surfaces of the end portions 311, respectively, and are symmetrically opposite each other. Each flexible fixture 40 includes a resisting section 41, a connecting section 42 extending downward and perpendicularly from one edge of the resisting section 41, and an extending section 43 extending horizontally from one end of the connecting section 42 to the chip 22.

Figure 5:
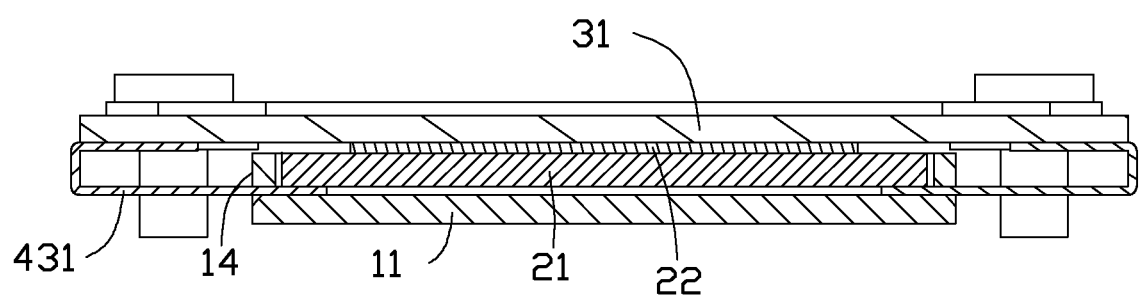
FIG. 5 is a cross-sectional view of the part of the electronic assembly with flexible fixtures of FIG. 1, taken along line V-V thereof, but omitting a heat pipe thereof.

Specifically, the resisting section 41 of each flexible fixture 40 is rectangular and flat. The resisting section 41 contacts the bottom surface of the corresponding end portion 311. A plurality of through holes is defined in the resisting section 41, for attaching the resisting section 41 to the end portion 311 with screws (not shown). A length of the connecting section 42 is smaller than that of the resisting section 41. The extending section 43 includes two extending arms 431 parallel to and spaced from each other. The extending arms 431 are in the shape of flat bars. The extending arms 431 extend from two opposite ends of the connecting section 42. The extending arms 431 are parallel with the resisting section 41 when the flexible fixture 40 is undeformed. The extending arms 431 extend through the corresponding positioning groove 15 between the two corresponding positioning blocks 14. Referring also to FIG. 5, two free ends of the extending arms 431 elastically contact an edge of the bottom plate 11 and are sandwiched between the substrate 21 and the bottom plate 11. Similarly, in other embodiments, the two free ends of the extending arms 431 can instead resist an edge of the substrate 21 around the chip 22.

One of the holding plates 50 includes a first positioning body 511 having a first positioning arm 521 extending therefrom. The other holding plate 50 includes a second positioning body 512 having two second positioning arms 522 extending therefrom. The first positioning body 511 is parallel with the second positioning body 512, and a length of the first positioning body 511 is shorter than that of the second positioning body 512.

The first positioning body 511 and the second positioning body 512 are disposed at the two opposite longitudinal sides of the heat spreader 31, and are aligned with the sidewalls 12. The first and second positioning bodies 511, 512 are located at two opposite longitudinal sides of the heat pipe 32. A plurality of positioning holes 513 are defined in each of the first positioning body 511 and the second positioning body 512, for attaching the first positioning body 511 and the second positioning body 512 on the heat spreader 31 with screws (not shown).

The first positioning arm 521 extends outwardly and perpendicularly from a middle of the first positioning body 511. The two second positioning arms 522 extend outwardly and obliquely from opposite ends of the second positioning body 512. A plurality of fastening holes 523 are defined at free ends of the first positioning arm 521 and the second positioning arms 522, respectively, for attaching the electronic assembly 100 onto the main board with screws 53.

Figure 4:
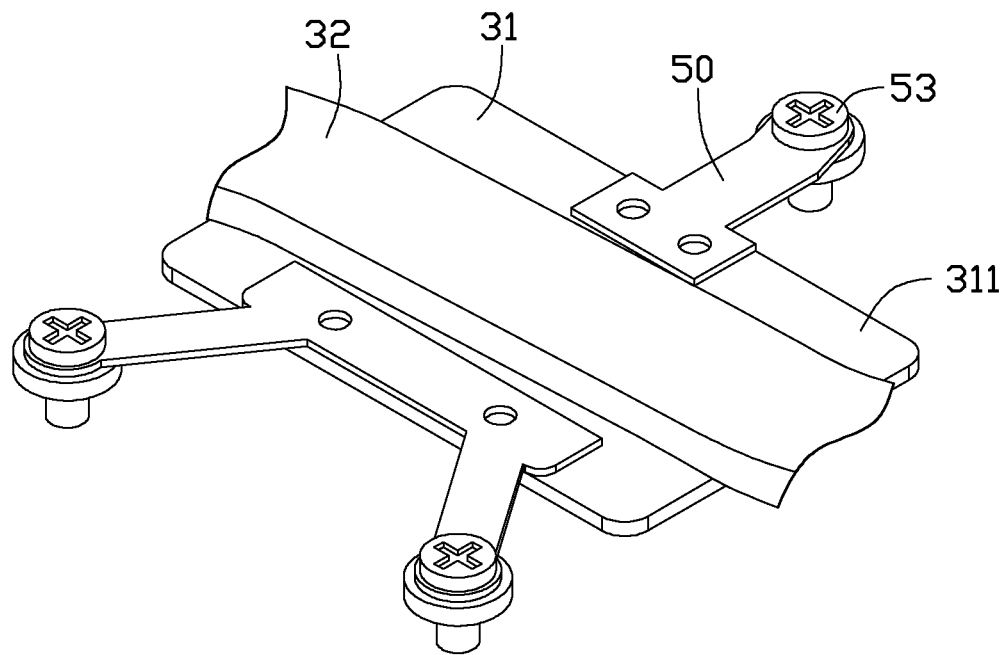
FIG. 4 is a partially assembled view of the part of the electronic assembly with flexible fixtures of FIG. 3.
Figure 4:
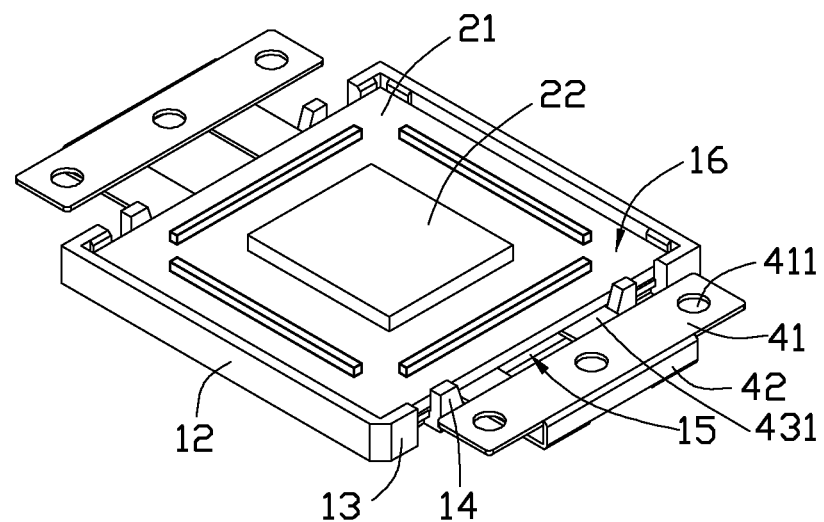

Referring to FIG. 4 and FIG. 5, when the electronic assembly 100 is assembled, the electronic component 20 is received in the socket 10, and the resisting sections 41 of the flexible fixtures 40 are attached to the bottom surfaces of the end portions 311 of the heat spreader 31. The resisting sections 41 of the flexible fixtures 40, the chip 22 and the extending sections 43 of the flexible fixtures 40 are all parallel to each other. The free ends of the extending arms 431 contact the edges of the bottom plate 11. Then the electronic assembly 100 is attached on the main board with the holding plates 50 and the screws 53.

When the screws 53 are driven downward during attachment of the electronic assembly 100 onto the main board, the holding plates 50 elastically deform slightly and firmly press the heat spreader 31 onto the chip 22 at the center of the substrate 21. Simultaneously, the resisting sections 41 elastically resist the bottom surface of the heat spreader 31 and thereby share part of the load of the pressing force exerted downward by the heat spreader 31.

Since the flexible fixtures 40 are engaged with the heat spreader 30, the force applied by the heat spreader 30 is spread across both the chip 22 and the flexible fixtures 40 at the periphery of the chip 22 relatively evenly, instead of simply being applied on the chip 22 only. The flexible fixtures 40 share part of the applied force, to protect peripheral edges of the substrate 21 from deformation that would otherwise occur if the applied force were concentrated solely on the chip 22.

Figure 6:
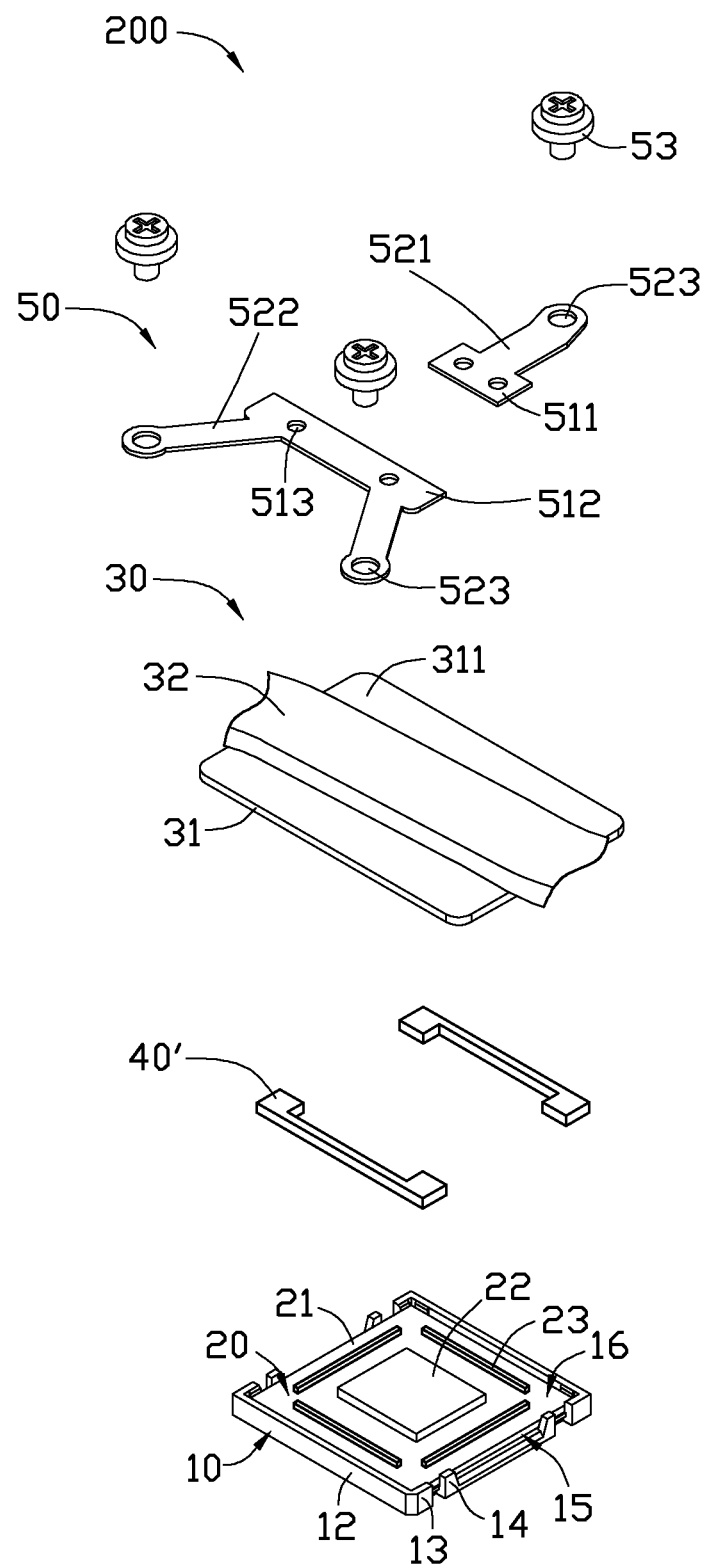
FIG. 6 is an exploded, isometric view of part of an electronic assembly with flexible fixtures in accordance with another embodiment of the disclosure.
Figure 7:
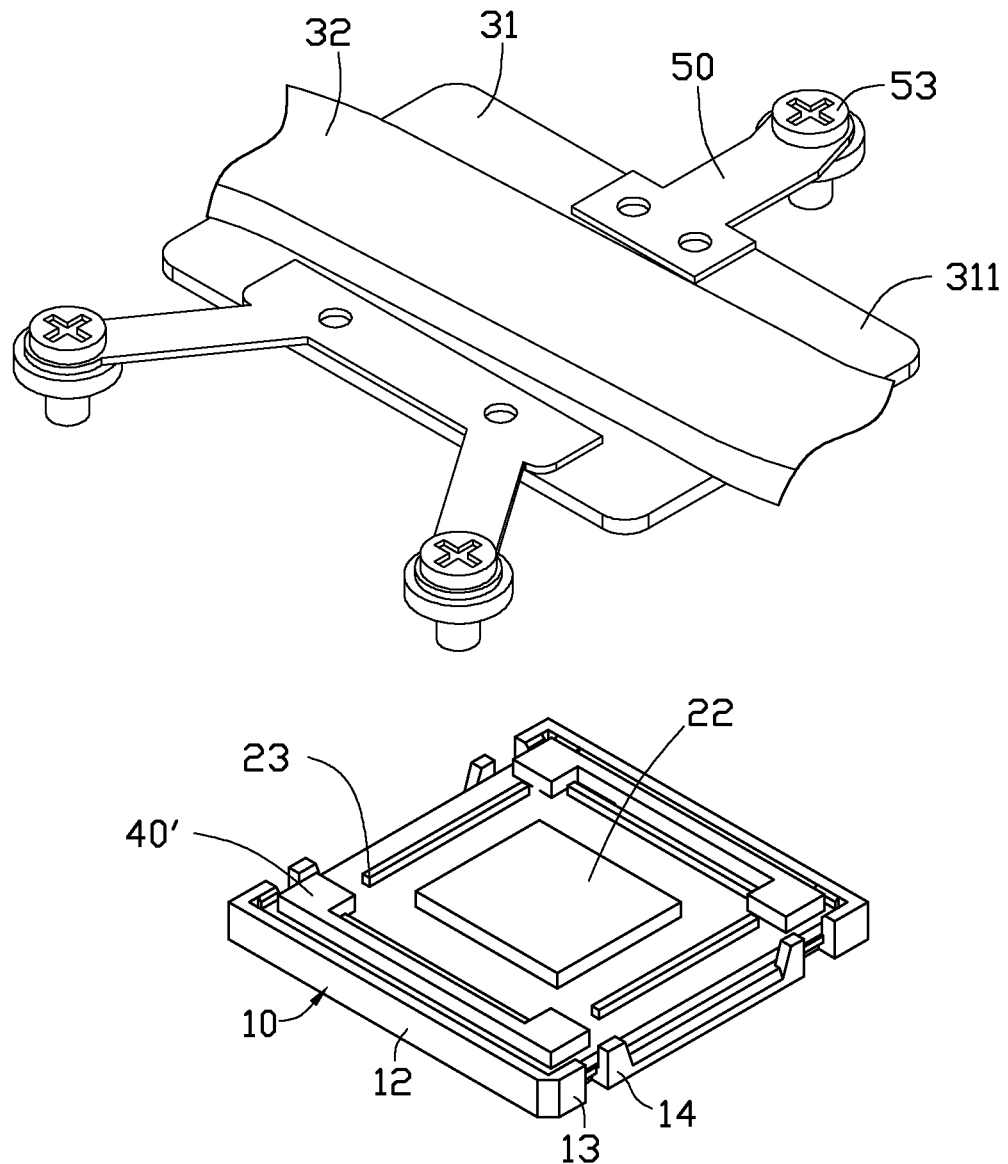
FIG. 7 is a partially assembled view of the part of the electronic assembly with flexible fixtures of FIG. 6.

Referring to FIG. 6 and FIG. 7, an electronic assembly 200 in accordance with another exemplary embodiment is provided. The main structure of the electronic assembly 200 is similar to that of the above-described electronic assembly 100. The difference between the electronic device 200 and the electronic assembly 100 is that in the electronic assembly 200, two flexible fixtures 40' are provided. The flexible fixtures 40' are made of resilient material such as rubber, etc, and are disposed at the bottom surface of the heat spreader 31. In this embodiment, each of the flexible fixtures 40' is "⊓" shaped (or approximately U-shaped), and the flexible fixtures 40' are attached to the bottom surface of the heat spreader 31.

When the electronic assembly 200 is assembled, the flexible fixtures 40' are sandwiched between the heat spreader 31 and the substrate 21, and are located at two opposite edges of the substrate 21 at a periphery of the chip 22. The flexible fixtures 40' resist two of the flexible bars 23. When the heat spreader 31 exerts downward pressing force, the force is spread across both the chip 22 and the flexible fixtures 40' relatively evenly, instead of simply being applied on the chip 22 only. Therefore, the peripheral edges of the substrate 21 avoid deformation that would otherwise occur if the applied force were concentrated solely on the chip 22. In other embodiments, the flexible fixtures 40' can be disposed on the substrate 21 in positions where they also resist the sidewalls 12.

Alternatively, the flexible fixtures 40 and the flexible fixtures 40' can be applied together in the one same electronic assembly, with the flexible fixtures 40, 40' being disposed at respective peripheries of the chip 22.

It is to be understood that the above-described embodiments are intended to illustrate rather than limit the disclosure. Variations may be made to the embodiments without departing from the spirit of the disclosure. The above-described embodiments illustrate the scope of the disclosure but do not restrict the scope of the disclosure.

What is claimed is:

1. An electronic assembly, comprising:
   a heat spreader;
   a socket and an electronic component received in the socket, the electronic component comprising a substrate and a chip disposed at a center of the substrate, the chip contacting a bottom surface of the heat spreader; and
   a pair of flexible fixtures, one end of each of the flexible fixtures abutting against the heat spreader, and another end of each of the flexible fixtures abutting against one of the substrate and the socket,
   wherein the pair of flexible fixtures are made of metallic material and are symmetrically opposite each other, each flexible fixture comprising a resisting section, a connecting section extending downward from one edge of the resisting section, and an extending section extending horizontally from one end of the connecting section of the chip, and
   wherein the extending section comprises two extending arms parallel to and spaced from each other, two free end of the two extending arms being sandwiched between the substrate and the socket.

2. The computer of claim 1, wherein the resisting section is rectangular and flat, and is parallel with the two extending arms when the flexible fixture is undeformed.

3. The computer of claim 1, wherein the socket comprises a rectangular bottom plate and two sidewalls extending perpendicularly upward from a pair of opposite edges of the bottom plate, free ends of the extending sections of the flexible fixtures resisting two opposite edges of the substrate, the heat spreader comprising two opposite end portions protruding out from opposite sides of the socket, and the resisting sections of the flexible fixtures resisting bottom surfaces of the end portions.

4. The electronic assembly of claim 3, wherein two positioning blocks are formed at each of two opposite edges of the bottom plate near the sidewalls, respectively, a positioning groove being formed between the two positioning blocks at each of the two opposite edges of the bottom plate, and the extending section of each flexible fixture extending through a corresponding one of the positioning grooves.

5. The electronic assembly of claim 1, wherein the flexible fixtures are made of resilient material and are attached to the bottom surface of the heat spreader, the pair of flexible fixtures being sandwiched between the heat spreader and the substrate, and the pair of flexible fixtures being arranged symmetrically.

6. The electronic assembly of claim 5, wherein the pair of flexible fixtures are located at two opposite edges of the substrate at a periphery of the chip.

7. The electronic assembly of claim 6, wherein the socket comprises a rectangular bottom plate and two sidewalls extending perpendicularly upward from two opposite edges of the bottom plate, and the flexible fixtures resist the two sidewalls, respectively.

8. The electronic assembly of claim 1, wherein a plurality of flexible bars is disposed on the substrate around the chip, and the flexible fixtures resist the flexible bars.

9. An electronic assembly, comprising:
a heat spreader;
a socket and an electronic component received in the socket, the electronic component comprising a substrate and a chip disposed at a center of the substrate, the chip contacting a bottom surface of the heat spreader; and
a pair of flexible fixtures disposed between a bottom surface of the heat spreader and the socket, the flexible fixtures elastically deformed and sharing part of the load of a pressing force exerted downward by the heat spreader on the electronic component,
wherein the pair of flexible fixtures are made of metallic material and are symmetrically opposite each other, each flexible fixture comprising a resisting section, a connecting section extending downward from one edge of the resisting section, and an extending section extending horizontally from one end of the connecting section to the chip, and wherein the extending section comprises two extending arms parallel to and spaced from each other, two free ends of the two extending arms being sandwiched between the substrate and the socket.

10. The computer of claim 9, wherein the resisting section is rectangular and flat, and is parallel with the two extending arms when the flexible fixture is underformed.

11. The computer of claim 9, wherein the socket comprises a rectangular bottom plate and two sidewalls extending perpendicularly upward from a pair of opposite edges of the bottom plate, free ends of the extending sections of the flexible fixtures resisting two opposite edges of the substrate, the heat spreader comprising two opposite end portions protruding out from opposite sides of the socket, and the resisting sections of the flexible fixtures resisting bottom surfaces of the end portions.

12. The electronic assembly of claim 11, wherein two positioning blocks are formed at each of two opposite edges of the bottom plate near the sidewalls, respectively, a positioning groove being formed between the two positioning blocks at each of the two opposite edges of the bottom plate, and the extending section of each flexible fixture extending through a corresponding one of the positioning grooves.

13. The electronic assembly of claim 9, wherein the flexible fixtures are made of resilient material and are attached to the bottom surface of the heat spreader, the pair of flexible fixtures being sandwiched between the heat spreader and the substrate, and the pair of flexible fixtures being arranged symmetrically.

14. The electronic assembly of claim 13, wherein the pair of flexible fixtures are located at two opposite edges of the substrate at a periphery of the chip.

15. The electronic assembly of claim 14, wherein the socket comprises a rectangular bottom plate and two sidewalls extending perpendicularly upward from two opposite edges of the bottom plate, and the flexible fixtures resist the two sidewalls respectively.

16. The electronic assembly of claim 9, wherein a plurality of flexible bars is disposed on the substrate around the chip, and the flexible fixtures resist the flexible bars.

* * * * *